United States Patent
Hiura et al.

(10) Patent No.: US 7,687,801 B2
(45) Date of Patent: Mar. 30, 2010

(54) DOPANT MATERIAL, DOPANT MATERIAL MANUFACTURING METHOD, AND SEMICONDUCTOR DEVICE USING THE SAME

(75) Inventors: Hidefumi Hiura, Tokyo (JP); Tetsuya Tada, Ibaraki (JP); Toshihiko Kanayama, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 1013 days.

(21) Appl. No.: 11/325,547

(22) Filed: Jan. 5, 2006

(65) Prior Publication Data
US 2010/0012923 A1 Jan. 21, 2010

(30) Foreign Application Priority Data
Jan. 6, 2005 (JP) .............................. 2005-001422

(51) Int. Cl.
*H01L 35/24* (2006.01)
(52) U.S. Cl. ......................................... 257/40; 257/607
(58) Field of Classification Search ................... 257/40, 257/76, 607, 613
See application file for complete search history.

(56) References Cited

U.S. PATENT DOCUMENTS

| | | | | |
|---|---|---|---|---|
| 7,247,548 | B2 * | 7/2007 | Tada et al. | 438/542 |
| 7,253,431 | B2 * | 8/2007 | Afzali-Ardakani et al. | 257/20 |
| 7,253,434 | B2 * | 8/2007 | Golovchenko et al. | 257/40 |
| 2004/0238887 | A1 | 12/2004 | Nihey | |

FOREIGN PATENT DOCUMENTS

| | | |
|---|---|---|
| JP | 08-188406 | 7/1996 |
| JP | 08-325195 | 12/1996 |
| JP | 2001-048509 A | 2/2001 |
| JP | 2003-017508 A | 1/2003 |
| JP | 2003-077923 A | 3/2003 |
| JP | 2004-067413 A | 3/2004 |
| JP | 2004-311733 A | 11/2004 |

OTHER PUBLICATIONS

M. Bockrath et al., "Chemical doping of individual semiconducting carbon-nanotube ropes," Physical Review B, vol. 61:6, Apr. 15, 2000, pp. R10606-R10608, The American Physical Society.
R Martel et al., "Ambipolar Electrical Transport in Semiconducting Single-Wall Carbon Nanotubes," Physical Review Letters, vol. 87:25, Dec. 17, 2001, pp. 256805-1-256805-4, The American Physical Society.

(Continued)

*Primary Examiner*—Mark Prenty
(74) *Attorney, Agent, or Firm*—Foley & Lardner LLP

(57) ABSTRACT

It is to provide a thermodynamically and chemically stable dopant material which can achieve controls of the pn conduction types, carrier density, and threshold value of gate voltage, and a manufacturing method thereof. Further, it is to provide an actually operable semiconductor device such as a transistor with an excellent high-speed operability and high-integration characteristic. Provided is a dopant material obtained by depositing, on a carbon nanotube, a donor with a smaller ionization potential than an intrinsic work function of the carbon nanotube or an acceptor with a larger electron affinity than the intrinsic work function of the carbon nanotube. The ionization potential of the donor in vacuum is desired to be 6.4 eV or less, and the electron affinity of the acceptor in vacuum to be 2.3 eV or more.

18 Claims, 9 Drawing Sheets

OTHER PUBLICATIONS

M. Shim et al., Polymer Functionalization for Air-Stable n-Type Carbon Nanotube Field-Effect Transistors, J. Am. Chem. Soc., vol. 123, 2001, pp. 11512-11513, American Chemical Society, Oct. 2001.

S. Tans et al., "Room-temperature transistor based on a single carbon nanotube," Letters to Nature, vol. 393, May 7, 1998, pp. 49-52, Macmillan Publishers Ltd.

* cited by examiner

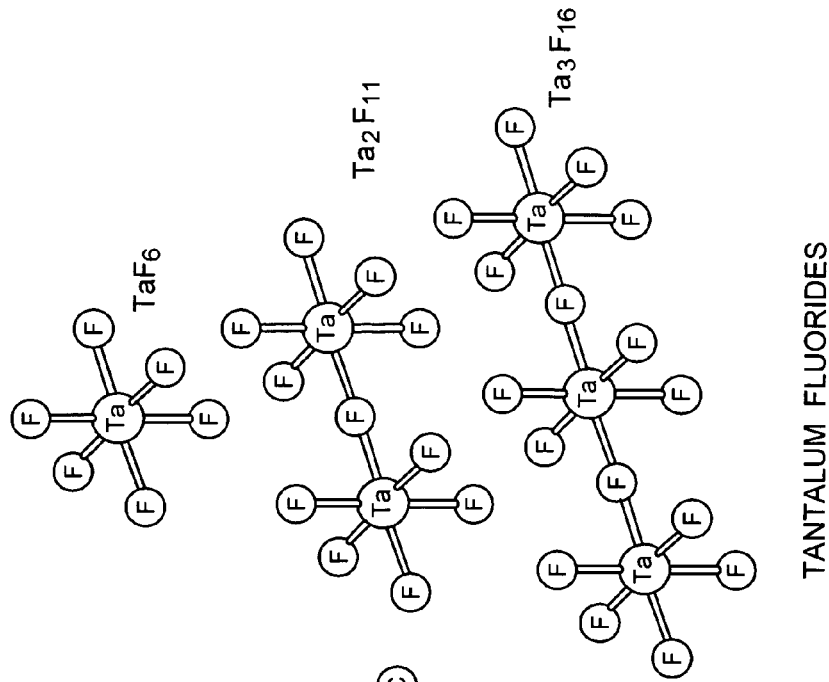
FIG. 2A — DECAMETHYLNICKELOCENE ($\eta$ [$C_5(CH_3)_5$]$_2$Ni) (HYDROGEN ATOM ELIMINATED)
FIG. 2B — FULLERENE MONOFLUORIDE ($C_{60}F$)
FIG. 2C — TANTALUM FLUORIDES: $TaF_6$, $Ta_2F_{11}$, $Ta_3F_{16}$

BEFORE DOPING

WITH DONOR DOPED

WITH ACCEPTOR DOPED

DOPANT MATERIAL, DOPANT MATERIAL MANUFACTURING METHOD, AND SEMICONDUCTOR DEVICE USING THE SAME

BACKGROUND OF THE INVENTION

1. Field of the Invention

The present invention relates to a dopant material using a carbon nanotube, a method for manufacturing the dopant material, and a semiconductor device such as a transistor which is preferable for p-type and n-type conduction semiconductor channels.

2. Description of the Related Art

A carbon nanotube has a tubular graphite structure with a diameter of some nanometers and a length of some hundreds nanometers to some micrometers. Depending on chirality and the diameter, there are metal-type carbon nanotubes and semiconductor-type carbon nanotubes. The semiconductor-type carbon nanotube can be used as a transistor channel. The semiconductor-type carbon nanotube is particularly important as a semiconductor material to be used as post silicon material in terms of device application, since it has more than ten times drift mobility than that of silicon and the structure of the band gap can be controlled by the diameter and chirality, etc. Ever since there was a report on a field-effect transistor comprising a carbon nanotube as a channel (non-patent literature 1), there have been studies and developments actively conducted on carbon nanotube transistors all over the world.

For practical implementation of the carbon nanotube transistor, it is necessary to develop techniques on several elements. Examples may be a technique for controlling diameter, position and orientation of carbon nanotube, a technique for selecting carbon nanotube metal/semiconductor, a low-resistance ohmic electrode technique, a technique for fabricating high-performance gate insulator film, a doping technique for carbon nanotube, etc. Particularly, the doping technique is important for controlling the conduction types such as p-type conduction and n-type conduction of the carbon nanotube transistor, carrier density, threshold value of the gate voltage, and the like, and it is the key stone to achieve high-performance and high-speed devices.

In general, "doping" means to add a foreign substance for controlling the property of a semiconductor (particularly, for controlling the conduction type of a semiconductor). There are two types in the conduction types of the semiconductor, one of which is n-type conduction and the other is p-type conduction. The semiconductor exhibiting n-type conduction is referred to as an n-type semiconductor, in which electrons supplied to the conduction band of the semiconductor from a donor (electron donor, n-type dopant) as a foreign substance in the n-type semiconductor perform electrical conduction. The semiconductor exhibiting p-type conduction is referred to as a p-type semiconductor, in which holes that are generated due to deprivation of electrons from a valence band of the p-type semiconductor by an acceptor (electron acceptor, p-type dopant) as a foreign substance perform electrical conduction. Referring to the carbon nanotube, the n-type conduction carbon nanotube or the p-type conduction carbon nanotube can be produced by doping an appropriate donor or acceptor.

As a conventional technique for producing the n-type conduction carbon nanotube, for example, there have been reported a method of potassium (K) vapor evaporation (see non-patent literature 2) and a method of vacuum heat treatment (see non-patent literature 3). However, carbon nanotube channels fabricated by those methods are chemically unstable in the air, thereby determined unsuitable for use in a device of stable action. As another conventional methods for producing the n-type conduction carbon nanotube, there are known a method of supplying polymer materials containing imine group from outside the carbon nanotube (see non-patent literature 4) and a method of introducing organic molecules as the donor with relatively low ionization energy into hollow of the carbon nanotube (see non-patent literature 1). However, it is very difficult with these methods to control the doping concentration, i.e. the carrier density within the carbon nanotube channel. Specifically, it is necessary with the latter method to prepare a carbon nanotube channel in which donor is filled in advance into the hollow of the carbon nanotube when fabricating a transistor. Thus, a transistor fabricating method which is essential for integration of the carbon nanotube transistor, e.g. doping on the transistor by growing the carbon nanotube in situ as disclosed in patent literature 2, cannot be applied, and specific operation property of the transistor and the like fabricated by the doping method is not presented.

Further, as a conventional technique for producing the p-type conduction carbon nanotube, there has been reported a method of naturally attaching oxygen/water molecules which are considered as the source for hole supply from the atmosphere without applying a special treatment to the carbon nanotube. However, in a device that uses the carbon nanotube fabricated by this method, the property of the carbon nanotube transistor changes depending on the external environment. Therefore, it is not reliable. As still another conventional technique for producing the p-type conduction carbon nanotube, there is known a method of introducing organic molecules with relatively large electron affinity into the hollow of the carbon nanotube (see patent literature 1). However, it has the same disadvantages as those of the above-described method that it is very difficult to control the carrier density, inapplicable to the carbon nanotube transistor grown in situ, and that the specific device action is not clarified.

[Non-Patent Literature 1] Nature, vol. 393, pp 49-52, 1998

[Non-Patent Literature 2] Physical Review B, vol. 61, pp R10606-R10608, 2000

[Non-Patent Literature 3] Physical Review, Letters, vol. 87, pp 256805-256808, 2001

[Non-Patent Literature 4] Journal of American Chemical Society, vol. 123, pp 11512-11513, 2001

[Patent Literature 1] Japanese Patent Unexamined Publication 2004-311733 (FIG. 1, FIG. 3)

[Patent Literature 2] Japanese Patent Unexamined Publication 2004-67413 (FIG. 17)

SUMMARY OF THE INVENTION

The present invention has been designed in view of the aforementioned circumstances. It is therefore an object of the present invention to provide a thermodynamically and chemically stable dopant material, which enables controls of pn conduction types, carrier density, and a threshold value of the gate voltage by being doped on the peripheral surface of a carbon nanotube. Further, another object of the present invention is to provide a manufacturing method of the doping material, which achieves high adaptability and an excellent electrical property control in fabricating a carbon nanotube semiconductor device by depositing the material from outside the carbon nanotube. Furthermore, still another object of the present invention is to provide a semiconductor device such as a transistor having an excellent high-speed operability/high integration property, which can be actually operated, by using the obtained dopant material.

In order to achieve the foregoing objects, the inventors of the present invention have conducted devoted study and research on doping for the carbon nanotube. As a result, for the doping of the carbon nanotube, the inventors have found that a necessary condition for inducing charge transfer can be described according to the electronic structures of a semiconductor carbon nanotube and dopant as shown in FIG. 1, having the charge transfer caused between the surface of the carbon nanotube and the dopant as the fundamental principle. The inventors have found the followings. The condition for inducing charge transfer for supplying electrons from the donor to the carbon nanotube is that the highest occupied molecular orbital level of the donor (ionization potential: corresponds to $I_P$) is over a Fermi ($E_F$) level of the carbon nanotube, which can be expressed as $I_P < E_F$ for the donor present on the carbon nanotube surface. The condition for inducing charge transfer for supplying holes from an acceptor to the carbon nanotube is that the lowest unoccupied molecular orbital level of the acceptor (electron affinity: corresponds to $E_A$) is lower than the Fermi ($E_F$) level of the carbon nanotube, which can be expressed as $E_A > E_F$ for the acceptor present on the carbon nanotube surface. $E_F$ is consistent with intrinsic work function (Ei) of the carbon nanotube, provided that the carbon nanotube before doping is an intrinsic semiconductor. Ei of the carbon nanotube is 3.7-4.8 eV (electron volt) and, in general, $I_P$ on the solid surface decreases approximately by 1 eV compared to $I_P$ in vacuum, and $E_A$ on the solid surface increases approximately by 1 eV compared to $E_A$ in vacuum. Thus, it is found that $I_P$ in vacuum is smaller than 6.4 eV as the condition for the donor, and $E_A$ in vacuum is larger than 2.3 eV as the condition for the acceptor. In that case, as can be seen from FIG. 1, the lowest limit value as the condition for the donor is not limited and may be extremely close to zero as long as the ionization potential in vacuum is 6.4 eV or less. The upper limit value for the acceptor is not limited and may be infinitely great as long as the electron affinity in vacuum is 2.3 eV or more. It is found that depositing the dopant of such condition on the carbon nanotube allows easy control of the deposit amount, a desired carrier density and provides a doping material having a stable conduction property. In view of these findings, the inventors have come to achieve the present invention.

Specifically, as the fundamental structure, the dopant material according to the present invention comprises a carbon nanotube on which a donor with a smaller ionization potential than an intrinsic work function of the carbon nanotube or an acceptor with a larger electron affinity than the intrinsic work function of the carbon nanotube is deposited. Preferably, the ionization potential of the donor in vacuum is desired to be 6.4 eV or less. Further, the electron affinity of the acceptor in vacuum is desired to be 2.3 eV or more. More preferably, it is desirable that the donor be dopant material which contains one kind or two kinds or more of materials selected from a group consisting of an alkaline earth metal element, a typical metal element, a lanthanide metal element, and an organic metal compound. It is desirable that the alkaline earth metal element, the typical metal element, or the lanthanide metal element be any one of strontium (Sr), barium (Ba), indium (In), lanthanum (La), cerium (Ce), praseodymium (Pr), neodymium (Nd), samarium (Sm), europium (Eu), and lutetium (Lu). The organic metal compound is desired to be metallocene. It is desired that the metallocene be cobaltocene ($\eta(C_5H_5)_2Co$), chromocene ($\eta(C_5H_5)_2Cr$), decamethylcobaltocene ($\eta[C_5(CH_3)_5]_2Co$), decamethylchromocene ($\eta[C_5(CH_3)_5]_2Cr$), or decamethylnickelocene ($\eta[C_5(CH_3)_5]_2Ni$). It is the dopant material wherein the acceptor is a fullerene and/or super halogen, and the fullerene is desired to be any one of higher fullerenes such as $C_{74}$, $C_{76}$, $C_{78}$, $C_{80}$, $C_{82}$, endohedral metallofullerenes such as $Ca@C_{60}$, $La@C_{74}$, $Gd@C_{74}$, $Gd@C_{76}$, $Gd@C_{78}$, $Gd@C_{80}$, $Gd@C_{82}$, and fullerene fluorides such as $C_{60}F$, $C_{60}F_2$, $C_{60}F_{36}$, $C_{60}F_{48}$, $C_{70}F_2$, $C_{70}F_{52}$. Further, the super halogen is desired to be any one of aluminum tetrafluoride ($AlF_4$), hafnium hexafluoride ($HfF_6$), tantalum hexafluoride ($TaF_6$), tungsten hexafluoride ($WF_6$), rhenium hexafluoride ($ReF_6$), osmium hexafluoride ($OsF_6$), iridium hexafluoride ($IrF_6$), platinum hexafluoride ($PtF_6$), gold hexafluoride ($AuF_6$), mercury hexafluoride ($HgF_6$), arsenic hexafluoride ($AsF_6$), phosphorus hexafluoride ($PF_6$), antimony hexafluoride ($SbF_6$), tellurium heptafluoride ($TeF_7$), tungsten heptafluoride ($WF_7$), manganese octafluoride ($MnF_8$), dialuminum heptafluoride ($Al_2F_7$), diphosphorus hendecafluoride ($P_2F_{11}$), ditantalum hendecafluoride ($Ta_2F_{11}$), divanadium hendecafluoride ($V_2F_{11}$), tritantalum hexadecafluoride ($Ta_3F_{16}$), triarsenic hexadecafluoride ($As_3F_{16}$), phosphorus hexachloride ($PCl_6$), dialuminum heptachloride ($Al_2Cl_7$), phosphorus hexabromine ($PBr_6$), or dialuminum heptabromine ($Al_2Br_7$).

The method for manufacturing the dopant material according to the present invention performs, in order, the steps of: setting, in a vacuum atmosphere, a single or a plurality of carbon nanotubes disposed on a substrate; and depositing, on the carbon nanotube, a donor with a smaller ionization potential than an intrinsic work function of the carbon nanotube or an acceptor with a larger electron affinity than the intrinsic work function of the carbon nanotube. The deposition processing is desired to be processing for placing the donor or the acceptor on a peripheral surface of the carbon nanotube by a neutral vapor deposition, or processing for placing the donor or the acceptor on the peripheral surface of the carbon nanotube by an ion beam deposition.

Furthermore, the dopant material according to the present invention can be applied to a semiconductor device and a transistor. The semiconductor device to which the dopant material of the present invention is applied is built in a structure that comprises, as a device, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube. The transistor to which the dopant material of the present invention is applied is built in a structure that comprises, as a channel of the transistor, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube. In the semiconductor device and the transistor according to the present invention, the above-described dopant material according to the present invention is used as the semiconductor material.

The doping material of the present invention, which has an excellent thermodynamic/chemical stability, can achieve controls of pn conduction types, carrier density, and a threshold value of the gate voltage by being doped on a carbon nanotube. Further, the doping material manufacturing method of the present invention can provide a doping material which achieves high adaptability and an excellent electrical property control in fabricating a carbon nanotube semiconductor device. Furthermore, the semiconductor device of the present invention such as a transistor uses the doping material of the present invention, which has an excellent high-speed operability and high integration characteristic to be applicable for practical use.

BRIEF DESCRIPTION OF THE DRAWINGS

FIG. 2 is an illustration showing the molecular structures of the dopant in the dopant material according to the present invention;

DETAILED DESCRIPTION OF THE PREFERRED EMBODIMENTS

In the followings, embodiments of the present invention will be described in detail.

Figure 1:
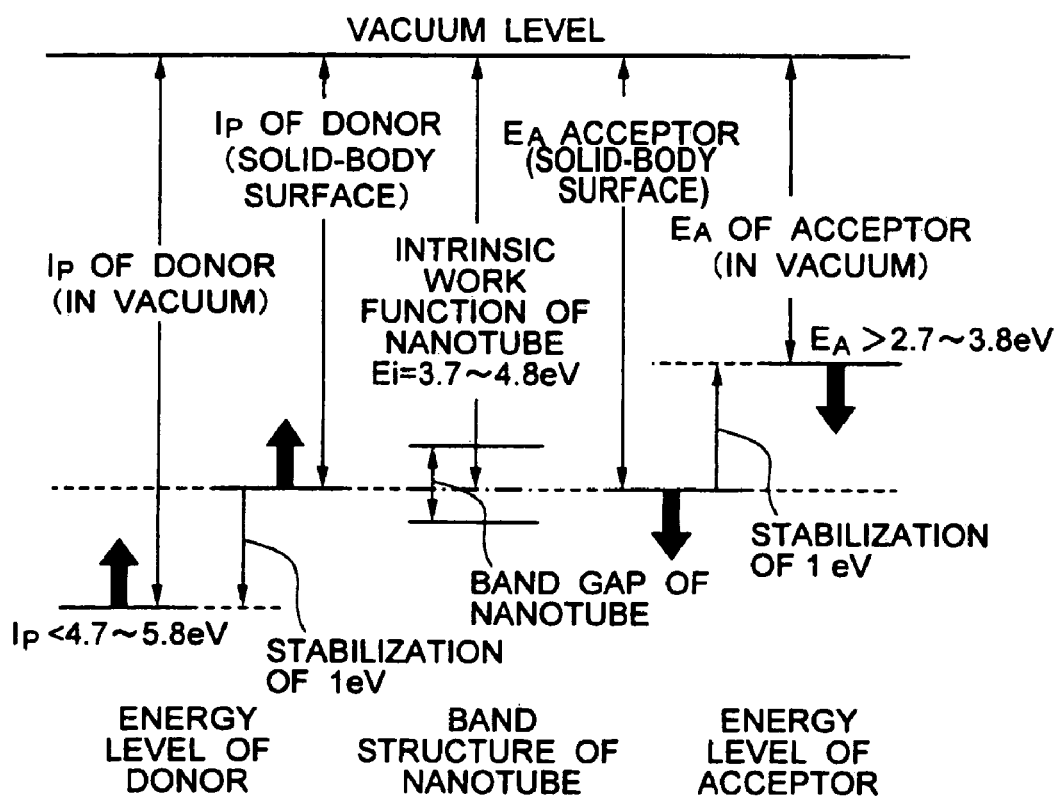
FIG. 1 is a schematic illustration showing energy levels of carbon nanotube and dopant for describing necessary conditions of a donor or an acceptor for a dopant material according to the present invention.

The dopant material of the present invention is obtained by depositing, on a carbon nanotube, a donor having a smaller ionization potential than the intrinsic work function of the carbon nanotube or an acceptor having a larger electron affinity than the intrinsic work function of the carbon nanotube. As the donor with a smaller ionization potential than the intrinsic work function of the carbon nanotube, it is desirable to use the donor having the ionization potential of 6.4 eV or less in vacuum. Further, as the acceptor with a larger electron affinity than the intrinsic work function of the carbon nanotube, it is desirable to use the acceptor having the electron affinity of 2.3 eV or more in vacuum. In that case, as can be seen from FIG. 1, the lowest limit value as the condition of the donor is not limited and may be extremely close to zero as long as the ionization potential in vacuum is 6.4 eV or less. The upper limit value of the acceptor is not limited and may be infinitely great as long as the electron affinity in vacuum is 2.3 eV or more.

The property values of the donor and the acceptor are not limited to the above-described values. Specifically, the donor may have any property value as long as it has a smaller ionization potential than the intrinsic work function of the carbon nanotube. Further, the acceptor may have any property values as long as it has a larger electron affinity than the intrinsic work function of the carbon nanotube.

As the carbon nanotube used for the dopant material of the present invention, both a single-walled and multi-walled types may be used as long as it has a tubular graphite structure. However, it is preferable to use a semiconductor-type carbon nanotube with a diameter of some nanometers and a length of some nanometers to some micrometers.

As the donor used in the dopant material of the present invention, it is desirable to have such a property that the ionization potential in vacuum is 6.4 eV or less. Specifically, used as the donor may be alkaline earth metal elements such as Sr ($I_P$=5.695 eV), Ba ($I_P$=5.212 eV), typical metal elements such as In ($I_P$=5.786 eV), and lanthanide metal elements such as La ($I_P$=5.577 eV), Ce ($I_P$=5.47 eV), Pr ($I_P$=5.42 eV), Nd ($I_P$=5.49 eV), Sm ($I_P$=5.63 eV), Eu ($I_P$=5.67 eV), Lu ($I_P$=5.426 eV). These metal elements are chemically stable compared to alkaline metals such as potassium and the like, which effectively function as the stable donor for the carbon nanotube.

Further, an organic metal compound may be used as the donor. Specifically, it is desirable for the donor as the organic metal compound to use metallocene such as cobaltocene: $\eta(C_5H_5)_2Co$ ($I_P$=5.2 eV), chromocene: $\eta(C_5H_5)_2Cr$ ($I_P$=5.40 eV), decamethylcobaltocene: $\eta[C_5(CH_3)_5]_2Co$ ($I_P$=3.7±0.3 eV), decamethylchromocene: $\eta[C_5(CH_3)_5]_2Cr$ ($I_P$=4.0±0.4 eV), decamethylnickelocene: $\eta[C_5(CH_3)_5]_2Ni$ ($I_P$=4.4 eV). The aforementioned metallocenes are known as thermodynamically and chemically stable organic metal compounds, exhibiting an excellent stability as the donor for the carbon nanotube. FIG. 2A shows the molecular structure of decamethylnickelocene.

The above-described materials can be used alone or in combination of two kinds or more as necessary as the donor.

As the acceptor used in the dopant material of the present invention, it is desirable to use the fullerene and/or super halogen which are known to be thermodynamically and chemically stable. As the fullerenes, it is desirable to use higher fullerene with carbon number of 70 or more, which is of cage-type molecules constituted only with carbon atoms, fullerene fluoride with a molecular structure of FIG. 2B such as $C_{60}F$, in which some fluorine atoms are added to fullerene molecule, endhedral metallofullerenes that contains some metal atoms within the cage structure of fullerene. Specifically, as the fullerenes, it is desirable to use higher fullerenes such as $C_{74}$ ($E_A$=3.30 eV), $C_{76}$ ($E_A$=2.90 eV), $C_{78}$ ($E_A$=3.12 eV), $C_{80}$ ($E_A$=3.19 eV), $C_{82}$ ($E_A$=3.14 eV), fullerene fluorides such as $C_{60}F$ ($E_A$=2.78 eV), $C_{60}F_2$ ($E_A$=2.74 eV), $C_{60}F_{36}$ ($E_A$=3.48 eV), $C_{60}F_{48}$ ($E_A$=4.06 eV), $C_{70}F_2$ ($E_A$=2.80 eV), $C_{70}F_{52}$ ($E_A$=4.06 eV), and endhedral metallofullerenes such as Ca@$C_{60}$ ($E_A$=3.0 eV), La@$C_{74}$ ($E_A$=2.9 eV), Gd@$C_{60}$ ($E_A$=3.0 eV), Gd@$C_{74}$ ($E_A$=3.24 eV), Gd@$C_{76}$ ($E_A$=3.1 eV), Gd@$C_{78}$ ($E_A$=3.26 eV), Gd@$C_{80}$ ($E_A$=3.3 eV), Gd@$C_{82}$ ($E_A$=3.3 eV). The aforementioned fullerenes have carbon as the main structural element like the carbon nanotube. Therefore, it exhibits high affinity for the carbon nanotube so that it is preferable as the acceptor.

The composition formula of super halogen used as the acceptor can be expressed as $MX_{k+1}$ (M is typical element metal atom or transition metal atom, X is halogen atom, k is the greatest formal valence of the M atom), which indicates a compound group having a greater electron affinity than the structural halogen elements. It is known to be thermodynamically stable. As such super halogen, for example, it is desirable to use those with the molecular structure of FIG. 2C, such as $TaF_6$ ($E_A$=8.4 eV), $Ta_2F_{11}$ ($E_A$=11.84 eV), $Ta_3F_{16}$ ($E_A$=12.63 eV), and $AlF_4$ ($E_A$=7.96 eV), $HfF_6$ ($E_A$=8.8 eV), $WF_6$ ($E_A$=3.5 eV), $ReF_6$ ($E_A$=4.8 eV), $OsF_6$ ($E_A$=6.0 eV), $IrF_6$ ($E_A$=7.2 eV), $PtF_6$ ($E_A$=7.4 eV), $AuF_6$ ($E_A$=8.1 eV), $HgF_6$ ($E_A$=5.8 eV), $AsF_6$ ($E_A$=7.95 eV), $SbF_6$ ($E_A$=6.0 eV), $TeF_7$ ($E_A$=11.9 eV), $WF_7$ ($E_A$=6.505 eV), $MnF_8$ ($E_A$=6.7 eV), $Al_2F_7$ ($E_A$=11.16 eV), $P_2F_{11}$ ($E_A$=10.95 eV), $V_2F_{11}$ ($E_A$=10.98 eV), $As_3F_{16}$ ($E_A$=12.20 eV), $Al_2Cl_7$ ($E_A$=7.75 eV), $PBr_6$ ($E_A$=6.66 eV), and $Al_2Br_7$ ($E_A$=7.08 eV). The aforementioned super halogens are preferable since they exhibit high effects as the acceptors for the carbon nanotube and are excellent in the doping stability.

The above-described acceptors can be used alone or in combination of two kinds or more as necessary.

Figure 3A:
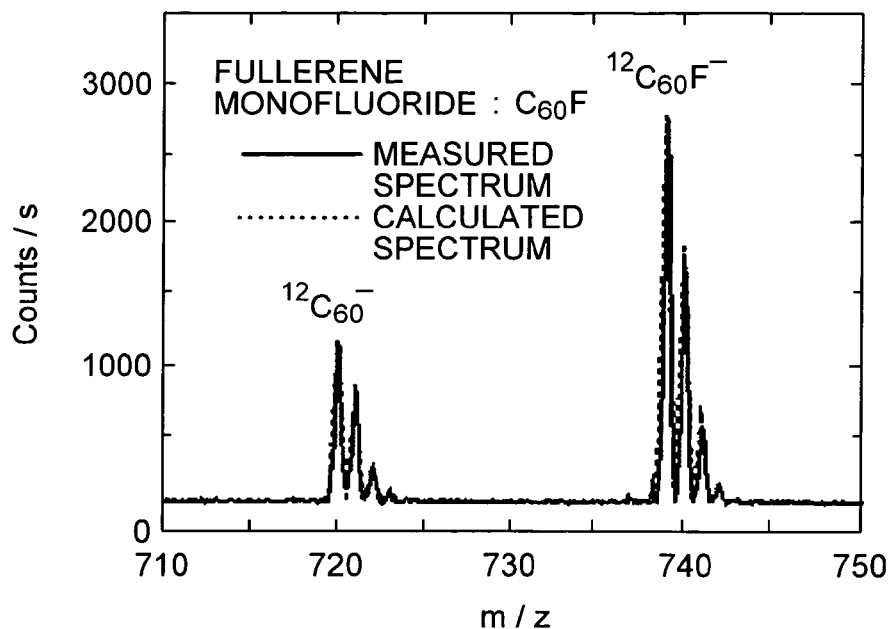
FIGS. 3A and 3B show the mass spectrum of dopant that is synthesized by an ion trap used for manufacturing the dopant according to the present invention.
Figure 3B:
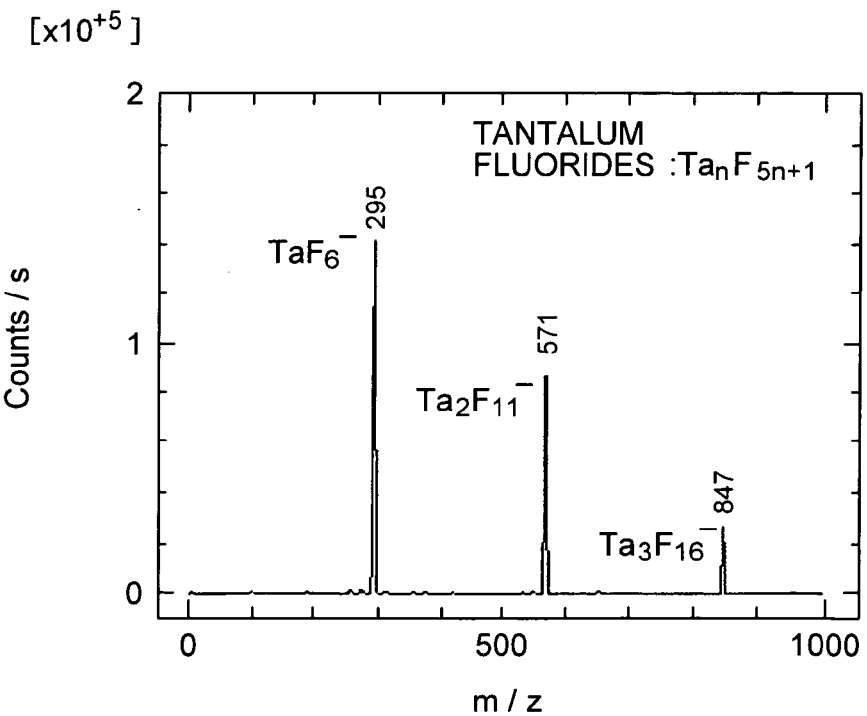
Figure 4A:
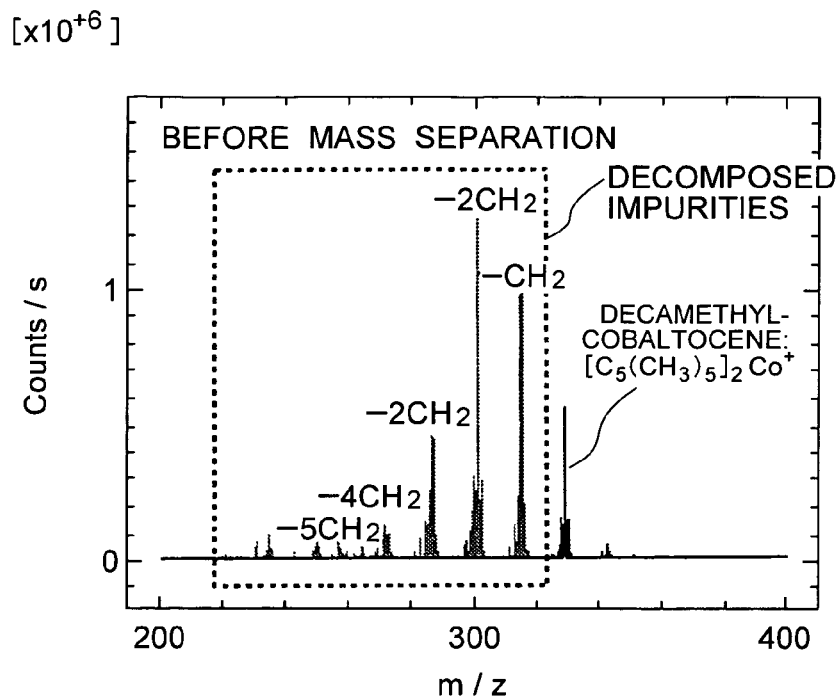
FIGS. 4A and 4B show the mass spectrum of dopant that is isolated from impurities by the ion trap used for manufacturing the dopant according to the present invention.
Figure 4B:
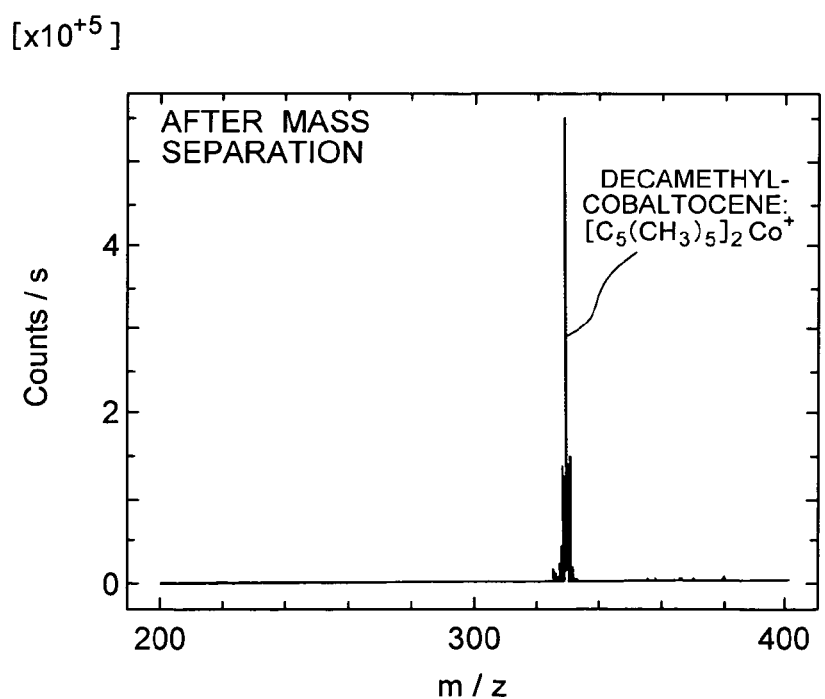

The dopant used in the dopant material of the present invention as the donor or acceptor for the carbon nanotube is preferable to be supplied in a neutral gaseous form that is obtained by heating the solid dopant, or in a gaseous phase as ions that are obtained by ionizing the heated and evaporated solid dopant. Dopant that cannot be obtained in the solid form can be supplied as gaseous phase by synthesizing it using an ion trap device disclosed in Japanese Granted Patent Publication No. 2869517. An example of the dopant synthesis using the ion trap in the case of $C_{60}Fn$ (n is the number of fluorine atoms) may start from $C_{60}$ that is available, which is synthesized by ion-molecule reaction of $C_{60}+nF^-\rightarrow C_{60}Fn^-$. FIG. 3A is the mass spectrum showing generation of fullerene monofluoride ($C_{60}F^-$) by the ion-molecule reaction. Further, in the case of tantalum fluoride type, that is, $Ta_nF_{5n+1}$ (n=1, 2, 3), tantalum pentafluoride ($TaF_5$) that is available is used as a starting material to be synthesized by ion-molecule reaction of $nTaF_5+F^-\rightarrow TanF_{5n+1}^-$. FIG. 3B is the mass spectrum showing generation of tantalum fluoride type by the ion-molecule reaction. When supplying dopant, it is preferable to supply pure dopant containing no impurities in terms of doping controllability. The ion trap with a mass-selection function is preferable since it is capable of separating and supplying only the target ions from the material containing the impurities. The above-described ion trap instrument is capable of supplying any types of dopant in extremely pure state containing no impurities. For example, as shown in the mass spectrum of FIG. 4, the instrument is preferable since it is capable of separating only decamethylcobaltocene by eliminating decomposition of decamethylcobaltocene.

The dopant material of the present invention is obtained by carrying out doping on the carbon nanotube through depositing the donor or the acceptor as the dopant on the peripheral surface of the carbon nanotube. For depositing the donor or the acceptor on the carbon nanotube, it is possible to deposit the donor or the acceptor as the dopant on the peripheral surface of the carbon nanotube that is placed on a substrate, by vapor evaporation methods such as atomic evaporation and molecular evaporation, or by an ion beam deposition method using ionized dopant, etc. Among those methods, it is preferable to employ the ion beam deposition. The first advantage of the ion beam deposition is that it is possible to promote charge transfer through performing doping by readily making the donors as positive ions and acceptors as negative ions, since the donor exhibits the doping capacity when positively charged and the acceptor exhibits it when negatively charged in charge transfer doping. The second advantage is that the kinetic energy of the dopant when doped on the carbon nanotube can be easily but accurately controlled since the kinetic energy of the dopant is determined solely by the difference between the initial potential of the dopant ion and the potential of the carbon nanotube surface when the dopant is ionized. The third advantage is that the dopant concentration can be determined accurately to extremely low concentration since ion current can be measured when the dopant is ionized.

Now, there is estimated the controllability of the dopant concentration in the ion beam deposition. Dopant concentration can be expressed as the surface density that can be calculated from {(ion current)×(deposition time)}/{elementary electric charge}×(cross section of beam)}. When using a doping instrument with the beam cross section of about 0.283 $cm^2$, the limit of ion current measurement is 0.1 pA (picoampere), and the minimum deposition time is 1 second, the lowest limit of the controllable dopant concentration becomes approximately $2.21\times10^6$ $cm^{-2}$. When the doping rate is defined as (dopant concentration)/(carbon atom density of carbon nanotube surface), the lower limit of the controllable doping rate becomes $5.95\times10^{-10}$ (0.595 ppb) that is an extremely low value, since the carbon atom density of the carbon nanotube surface is about $3.71\times10^{15}$ $cm^{-2}$. The ion current of the dopant can be increased sufficiently so that the doping rate of 100% or more is possible. That is, it is possible to control the doping concentration as precise as nine digits or more. Such precise controllability cannot be achieved by other methods. Therefore, the method of depositing the dopant as ion beams on the peripheral surface of the carbon nanotube is extremely preferable as the method for manufacturing the dopant material.

With the doping material of the present invention, the dopant concentration can be selected in accordance with a desired carrier density of the carbon nanotube. An increase in the carrier number of the donor due to doping of the carbon nanotube is an increasing function of $E_F$-$I_P$ (the energy difference between the highest occupied molecular orbital of the donor and Fermi level of the carbon nanotube). In case of the acceptor, it is an increasing function of $E_A$-$E_F$ (the energy difference between the lowest unoccupied molecular orbital of the acceptor and Fermi level of the carbon nanotube). The more the dopant concentration (that is, the donor concentration and acceptor concentration) increases, the more the carrier density within the carbon nanotube becomes. Thus, in order to obtain a desired carrier density of the doping material, the carrier density of the carbon nanotube may be controlled continuously when doped on the carbon nanotube by selecting appropriate dopant while measuring the dopant concentration. Particularly, use of the ion beam deposition allows accurate adjustment of the carrier density of the carbon nanotube over a wide range since it can precisely control the doping concentration over nine digits or more as described above.

As the semiconductor device of the present invention, any device may be used as long as it used the dopant material of the present invention. An example may be the device which is defined to have the starting end of the carbon nanotube in the doping material of the present invention as a source electrode and the terminal end as a drain electrode. Further, by providing the gate electrode beneath the carbon nanotube via the insulator layer, the transistor with the carbon nanotube functioning as the channel can be formed. In the transistor of the present invention, supply of potential to the gate electrode enables the ON/OFF action of the source/drain currents. The gate voltage by which the source/drain current changes from ON to OFF, i.e. the threshold value of the gate voltage, is an important parameter of the performance of the transistor. The threshold value of the gate voltage in the transistor of the present invention depends on the dopant concentration of the carbon nanotube. For example, when the donor is doped, the threshold value shifts on the minus voltage side, and when the acceptor is doped, the threshold value shifts on the plus voltage side. Since these shifts are in proportion to the dopant concentration, it is possible to control the threshold value of the gate voltage by controlling the dopant concentration doped in the carbon nanotube. Particularly, use of the ion beam deposition allows accurate adjustment of the threshold value of the gate voltage over a wide range since it can precisely control the doping concentration.

Figure 6A:
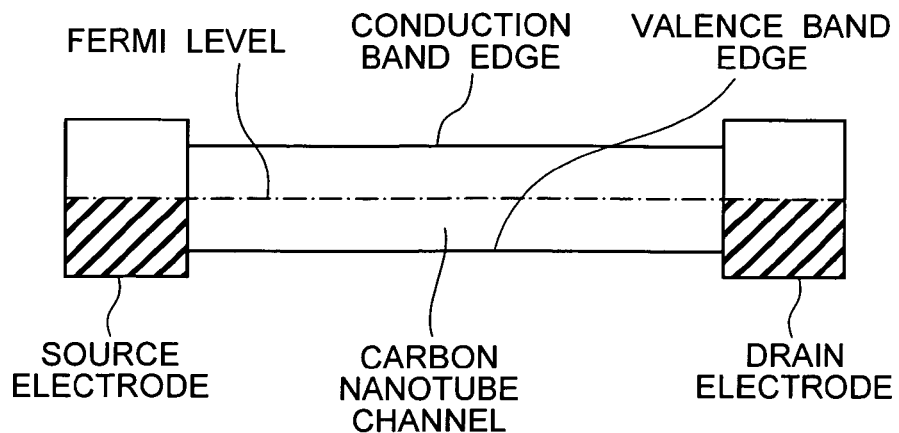
FIGS. 6A-6C are schematic illustrations showing the band structures of a transistor according to the present invention.
Figure 6B:
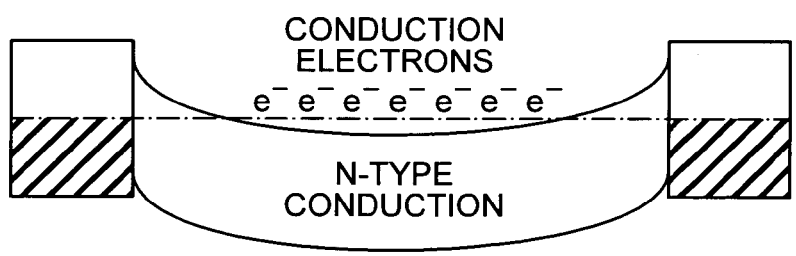
Figure 6C:
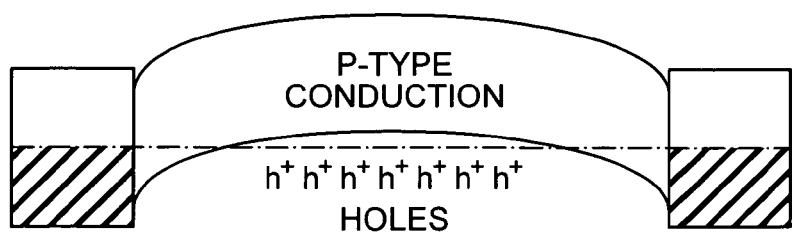

The band structure in the long-axis direction of the carbon nanotube in the transistor of the present invention will be described by referring to FIG. 6. In the carbon nanotube before doping as in FIG. 6A, the conduction band edge and valence band edge of the carbon nanotube are in parallel to the Fermi level, and the Fermi level is exactly in the middle of the conduction band edge and the valence band edge. Thus, there are carriers of an extremely small number for carrying out electrical conduction. In the meantime, in the state after doping of the donor as in FIG. 6B, the conduction band edge and the valence band edge are bent downwards and a large number of electrons are accumulated in the conduction band edge as carriers. Thus, the carbon nanotube behaves as an n-type semiconductor. Further, in the state after doping of acceptor as in FIG. 6C, inversely from the case of FIG. 6B, the conduction band edge and the valence band edge are bent upwards and a large number of holes are accumulated in the valence band edge as carriers. Thus, the carbon nanotube becomes a p-type semiconductor. When potential difference is applied between the source and drain electrodes on both ends, electrons flow into the n-type conduction carbon nanotube to which the donor is doped, and holes flow into the p-type conduction carbon nanotube to which the acceptor is doped.

Figure 5A:
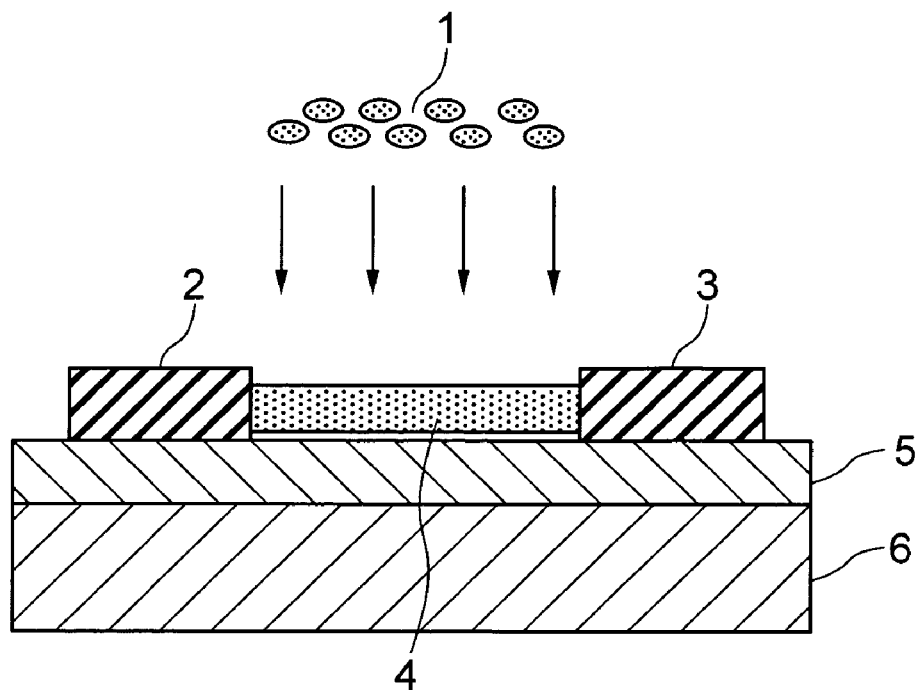
FIGS. 5A and 5B are illustrations showing a manufacturing method of the dopant according to the present invention.
Figure 5B:
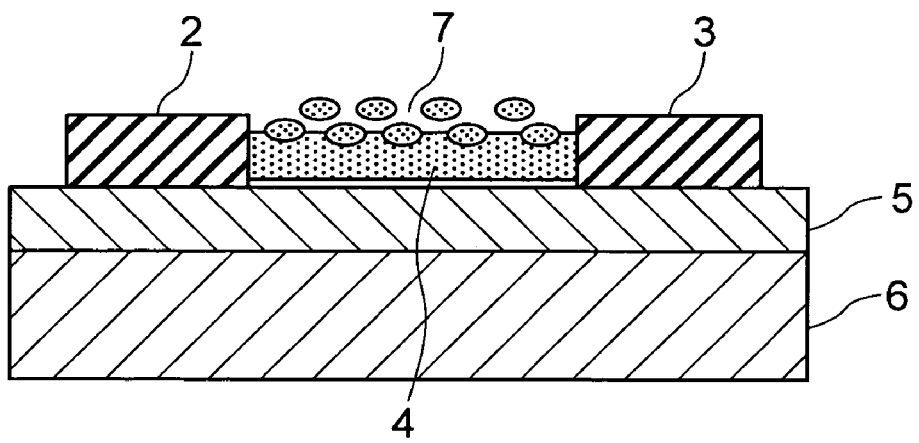

As an example of the manufacturing method of such transistor, a carbon nanotube 4 may be disposed between a source electrode 2 and a drain electrode 3, which are disposed on a gate electrode 6 via an insulator layer 5, and dopant 1 (the donor or the acceptor) is doped thereon in the state where both ends of the carbon nanotube are covered as shown in FIG. 5A. With this, the carbon nanotube 4 with dopant 7 deposited on the peripheral surface as shown in FIG. 5B can be obtained. In that case, a single or a plurality of carbon nanotubes may be disposed. In order to achieve practical use of the carbon nanotube electronic device, it is essential to place each transistor at prescribed positions of a substrate and achieve high integration. For this, as disclosed in Japanese Patent Unexamined Publication 2004-67413, it has to go through a great number of processing processes, e.g. an in situ process for growing the carbon nanotube at a prescribed position on the substrate, a process for fabricating electrodes, etc. The transistor according to the present invention is superior to other transistors in respect that the channel can be fabricated anytime between various processing processes and, particularly, the channel fabricating step can be performed even after the electrode structure is formed therein.

EXAMPLES

In the followings, Examples of the dopant material according to the present invention will be presented and described in detail. However, it is not intended to limit the technical scope of the present invention thereto. In Examples described below, dopant was doped on a carbon nanotube by ion beam deposition for fabricating a carbon nanotube transistor, and the operation characteristic thereof was measured.

The carbon nanotube transistor having the fundamental structure as shown in FIG. 5 was fabricated by the method disclosed in Japanese Patent Unexamined Publication 2004-67413. Gold was used as the material for the source and drain electrodes, silicon oxide film with a thickness of about 100 nm was used for the insulator film, and high-concentration n-type silicon was used for the gate electrode. The carbon nanotube was a single-walled carbon nanotube that was obtained by an in situ catalytic vapor growth, and the diameter thereof was typically about 1-2 nm. The distance between the source and drain electrodes, i.e. the typical length of the carbon nanotube channel, was about 300 nm. In most of the cases, there is a single carbon nanotube channel provided between the source and the drain.

For supplying the dopant ions and for doping by the ion beam deposition, used was an ion trap having the fundamental structure disclosed in Japanese Granted Patent Publication No. 2869517. The donor was supplied as positive ions and the acceptor was supplied as negative ions. The kinetic energy of the dopant was adjusted to be about 5-25 eV for allowing the dopant to soft-land on the carbon nanotube. As the donor, used were those materials that satisfied the conditions presented by the present invention as donor for the carbon nanotube, e.g. indium (In) having the $I_P$ value of 5.786 eV that was close to the upper limit of $I_P$<6.4 eV, decamethylnickelocene having the $I_P$ value of 4.4 eV that was sufficiently lower than the value of $I_P$<6.4 eV, and decamethylcobaltocene having the $I_P$ value of 3.7±0.3. Further, as the acceptor, used were the materials that satisfied the necessary conditions for the acceptor presented by the present invention, e.g. fullerene monofluoride ($C_{60}F$) having the $E_A$ value of 2.78 eV that was close to the lower limit of $E_A$>2.3 eV, and tantalum hexafluoride ($TaF_6$) having the $E_A$ value of 8.4 eV that was largely over the value of $E_A$>2.3 eV.

Indium was supplied as vapor in vacuum by a Knudsen cell, which was ionized by electron beam and trapped by the ion trap. After mass selection, it was transferred via an ion guide through a vacuum chamber where the carbon nanotube transistor was stored for performing doping. Decamethylnickelocene was heated and evaporated in vacuum and doped by the above-described method. Decamethylcobaltocene was doped in by the same method as that of the decamethylnickelocene. Fullerene monofluoride ($C_{60}F$) was synthesized from $C_{60}$ and fluoride ion by ion-molecule reaction within the ion trap, which was doped by the above-described method. Tantalum hexafluoride ($TaF_6$) was synthesized from tantalum pentafluoride and fluoride ion within the ion trap, which was doped by the above-described method.

If the carbon nanotube transistor is fabricated as it is without applying any special treatments, it functions as a p-type conduction transistor. This is due to oxygen, water, etc., which are attached in the vicinity of the carbon nanotube channel. For eliminating those, the carbon nanotube transistor before doping was annealed at about 200° C. for half a day to two days for obtaining the ambipolar conduction transistor exhibiting both the p-type and n-type conduction. The result was very much consistent with an intrinsic semiconducting picture shown in FIG. 6A, in which the Fermi level is in the middle of the conduction band edge and the valence band edge.

In the followings, the transistor properties measured by each dopant material of the present invention will be described.

Example 1

Figure 7A:
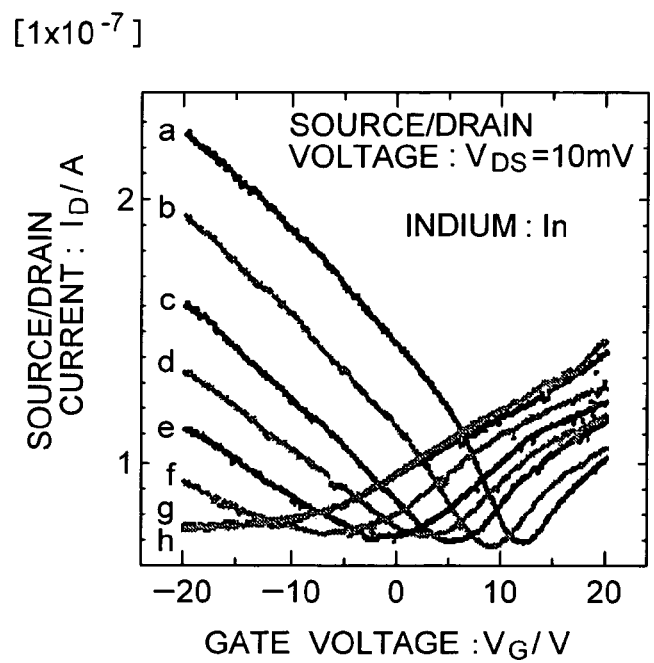
FIGS. 7A and 7B are graphs for showing changes in the transistor electric characteristic when the dopant concentration of the dopant material is varied according to Example 1 of the present invention.

FIG. 7A is a graph where the vertical axis is the source/drain current ($I_D$: a unit of ampere) and the horizontal axis is the gate voltage ($V_G$: a unit of volt), which shows the source/ drain current-gate voltage characteristic (referred to as $I_D$-$V_G$ characteristic hereinafter) of the carbon nanotube transistor to which indium positive ions (In$^+$) are doped. In the graph of FIG. 7A, "a" shows the state before doping, "b" is the case of doping In$^+$ of $2.00 \times 10^{13}$ cm$^{-2}$, "c" is the case of $5.00 \times 10^{13}$ cm$^{-2}$, "d" is the case of $1.00 \times 10^{14}$ cm$^{-2}$, "e" is the case of $2.00 \times 10^{14}$ cm$^{-2}$, "f" is the case of $4.00 \times 10^{14}$ cm$^{-2}$, "g" is the case of $8.00 \times 10^{14}$ cm$^{-2}$, and "h" is the case of $1.20 \times 10^{15}$ cm$^{-2}$. The source/drain voltage at the time of measurement was 10 mV in all the cases. In the $I_D$-$V_G$ characteristic before doping In$^+$ as shown by "a" in the graph of FIG. 7A, the p-type conduction increasing towards the minus side of the gate voltage and the n-type conduction increasing towards the plus side of the gate voltage emerge simultaneously. This is the ambipolar conduction of the carbon nanotube channel before doping. Then, by increasing the doping concentration of In$^+$ from "b" to "h", the p-type conduction decreased and the n-type conduction increased. The observation indicated that the carbon nanotube channel was converted to the n-type conduction, indicating that In functioned as the donor for the carbon nanotube. Further, it is clarified from the experiment that the $I_P$ value 5.785 eV of In is almost the upper limit of the condition for the donor, $I_P < 6.4$ eV, and that the condition for the donor according to the present invention is appropriate.

Then, changes in the carrier density of the carbon nanotube by doping were estimated. Based on the difference from the minimum value of the drain current ($I_D$), $I_D(V_G = +20V)$ at the doping concentration of $1.20 \times 10^{15}$ cm$^{-2}$ shown by "h" in the graph of FIG. 7A is increased for about 2.5 times with respect to $I_D$ before doping. This can be interpreted that the carrier density (conduction electron density) within the carbon nanotube is increased by 2.5 times approximately. As can be seen from "b" to "h" in the graph of FIG. 7A, it is clear that a gradual increase in the doping concentration enables control of the carrier density continuously. The threshold value of the gate voltage ($V_T$) is the gate voltage when $I_D$ decreases and reaches the minimum value. However, when the doping concentration of In$^+$ is increased, $V_T$ value shifts in the minus direction. From this observation result, it is also clear that In acts as the donor. Further, it has proved that doping effect of In$^+$ is stable for changes over time and In is a stable donor for the carbon nanotube.

Figure 7B:
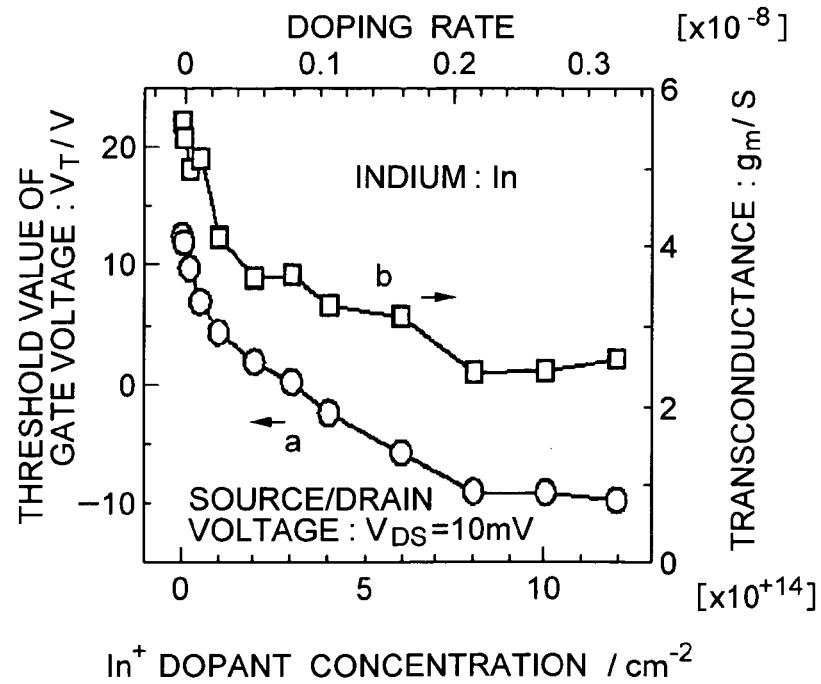

FIG. 7B is a graph where the right side of the vertical axis shows $V_T$ (a unit of volt), the left side of the vertical axis shows $g_m$ (a unit of siemens, Ampere/Volt=1/Ω), the lower side of the horizontal axis shows the doping concentration (a unit of cm$^{-2}$), and the upper side of the horizontal axis shows the doping rate, which shows In$^+$ dopant concentration (dopant rate) dependability of the gate voltage threshold value ($V_T$: "a", marked with circles) and transconductance ($g_m$: "b", marked with squares) of the carbon nanotube transistor to which indium positive ions (In$^+$) are doped. As described above, $V_T$ shifted on the minus side as the doping concentration increased. The change was about 20 V from about +12.6 V before doping to about −9.5 V at the maximum after the doping. The $V_T$ shift value is almost in proportional to the thickness of an insulator layer between the carbon nanotube and the gate electrode. Thus, the $V_T$ shift of about 20 V indicates the specific value for the insulator layer of 100 nm. Even if the thickness of the insulator layer becomes one-tenths, the $V_T$ controllability of about 2 V can be expected. The transconductance ($g_m$) is an important measure of the transistor characteristic, which is defined as the value obtained by partially differentiating the source/drain current with the gate voltage when the source/drain voltage is constant. $g_m$ is almost in proportional to the mobility so that it can be an index for showing the readiness of current flow. Presence of charged objects in the channel causes scattering of carriers. Thus, with doping, in general, there is caused a drastic deterioration in the mobility (or $g_m$). However, in the carbon nanotube transistor of the present invention, as shown in FIG. 7B, $g_m$ after doping decreased only about to a half at the maximum with respect to that before doping. This is considered as a result of suppression in $g_m$ deterioration to minimum, which is achieved since the carrier layer to which the conduction electrons flow and the doping layer in which the dopant is present are separated. Therefore, it has found that deposition of the dopant on the peripheral surface of the carbon nanotube of the semiconductor device such as the transistor makes outstanding contribution to the stability.

The same effects as those described above were achieved with alkaline earth metal element, e.g. strontium (Sr), barium (Ba), and lanthanide metal element.

Example 2

Figure 8:
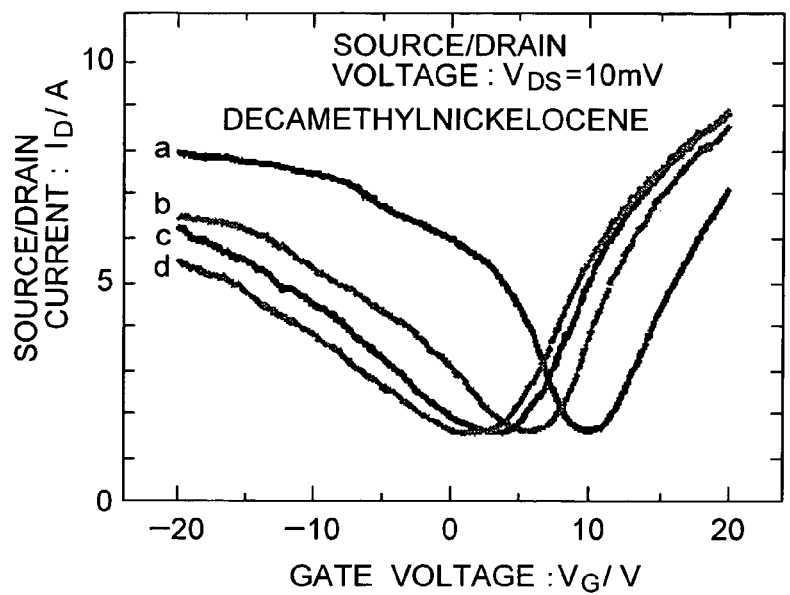
FIG. 8 is a graph for showing changes in the transistor electric characteristic when the dopant concentration of the dopant material is varied according to Example 2 of the present invention.

FIG. 8 is a graph showing the $I_D$-$V_G$ characteristic of the carbon nanotube transistor to which decamethylneckelocene positive ions ($\eta[C_5(CH_3)_5]_2Ni^+$) are doped. In FIG. 8, the vertical axis and the horizontal axis represent the same as those of FIG. 7A. In the graph of FIG. 8, "a" shows the state before doping, "b" is the case of doping $\eta[C_5(CH_3)_5]_2Ni^+$ of $1.0 \times 10^{13}$ cm$^{-2}$, "c" is the case of $7.50 \times 10^{13}$ cm$^{-2}$, and "d" is the case of $1.50 \times 10^{14}$ cm$^{-2}$. The source/drain voltage at the time of measurement was 10 mV in all the cases. As in the case of Example 1, the n-type conduction appeared on the plus side of the gate voltage increased in accordance with the increase of the doping concentration, and the p-type conduction on the minus side was suppressed. This indicates that the conduction type of the carbon nanotube channel is converted to the n-type conduction by doping $\eta[C_5(CH_3)_5]_2Ni^+$. It was also observed that the $V_T$ value shifted on the minus side in accordance with the increase in the doping concentration of $\eta[C_5(CH_3)_5]_2Ni^+$. It was found from the experiment that $\eta[C_5(CH_3)_5]_2Ni^+$ served as the donor for the carbon nanotube. Further, it is clarified that doping effect of $\eta[C_5(CH_3)_5]_2Ni^+$ is stable for changes over time and $\eta[C_5(CH_3)_5]_2Ni^+$ is a stable donor for the carbon nanotube. As described above, as in Example 1, it has found that the use of $\eta[C_5(CH_3)_5]_2Ni^+$ enables suppression of the p-type conduction and reinforcement of the n-type conduction in the carbon nanotube transistor, which allows continuous controls of the carrier concentration and the $V_T$ value.

Example 3

Figure 9:
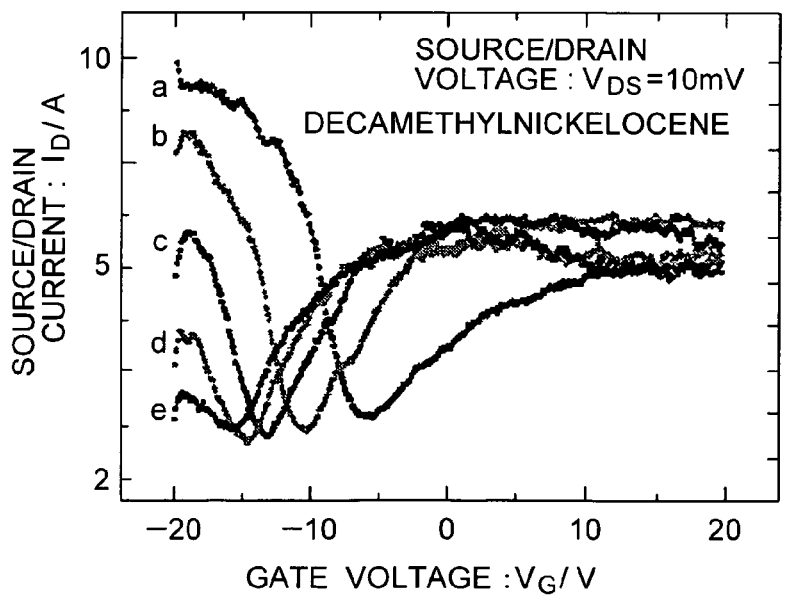
FIG. 9 is a graph for showing changes in the transistor electric characteristic when the dopant concentration of the dopant material is varied according to Example 3 of the present invention.

FIG. 9 is a graph for showing the $I_D$-$V_G$ characteristic of the carbon nanotube transistor to which decamethylcobaltocene positive ions ($\eta[C_5(CH_3)_5]_2Co^+$) are doped. In FIG. 9, the vertical axis and the horizontal axis represent the same as those of FIG. 7A. In the graph of FIG. 9, "a" shows the state before doping, "b" is the case of doping $\eta[C_5(CH_3)_5]_2Co^+$ of $2.0 \times 10^{13}$ cm$^{-2}$, "c" is the case of $4.00 \times 10^{13}$ cm$^{-2}$, "d" is the case of $6.00 \times 10^{13}$ cm$^{-2}$, and "e" is the case of $1.00 \times 10^{14}$ cm$^{-2}$. The source/drain voltage at the time of measurement was 10 mV in all the cases. As in the cases of Examples 1 and 2, the n-type conduction appeared on the plus side of the gate voltage increased in accordance with the increase of the doping concentration, and the p-type conduction on the minus side was suppressed. Particularly, in the case of "e" where $\eta[C_5(CH_3)_5]_2Co^+$ of $1.00 \times 10^{14}$ cm$^{-2}$ was doped, most of the p-type conduction disappeared and the carbon nanotube channel was almost perfectly converted to the n-type conduction. Furthermore, as in Examples 1 and 2, it was also observed that the $V_T$ value shifted on the minus side in accordance with the increase in the doping concentration of $\eta[C_5(CH_3)_5]_2Co^+$. It was found from the experiment that $\eta[C_5(CH_3)_5]_2Co^+$ functioned as the donor for the carbon nanotube. Further, it is clarified that doping effect of $\eta[C_5(CH_3)_5]_2Co^+$ is stable for changes over time and $\eta[C_5(CH_3)_5]_2Co^+$ is a stable donor for the carbon nanotube. As described above, as in Examples 1 and 2, it has found that the use of $\eta[C_5(CH_3)_5]_2Co^+$ enables suppression of the p-type conduction and reinforcement of the n-type conduction in the carbon nanotube transistor, which allows controls of the carrier concentration and the $V_T$ value accurately and continuously.

The same effects as those described above were achieved with metallocenes such as cobaltocene, chromocene, decamethylchromocene, etc.

Example 4

Figure 10:
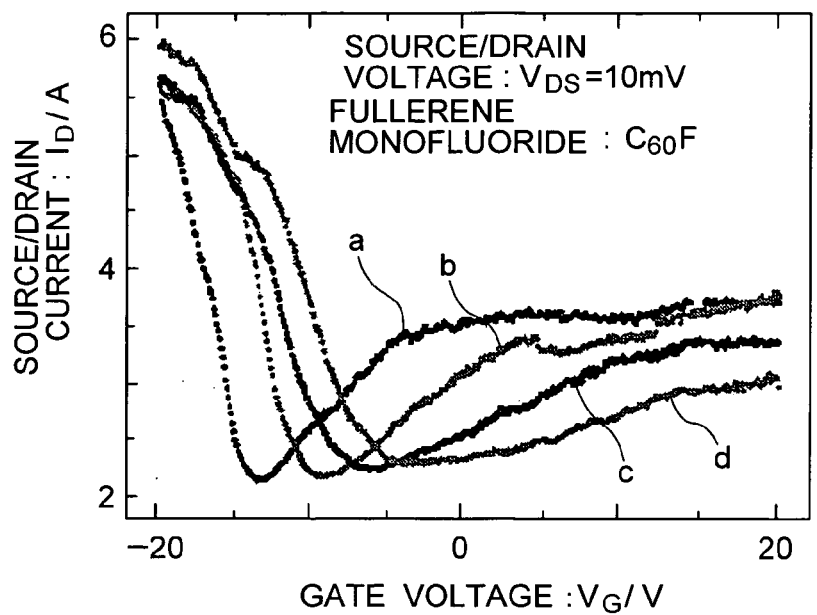
FIG. 10 is a graph for showing changes in the transistor electric characteristic when the dopant concentration of the dopant material is varied according to Example 4 of the present invention.

FIG. 10 is a graph for showing the $I_D$-$V_G$ characteristic of the carbon nanotube transistor to which fullerene monofluoride negative ions ($C_{60}F^-$) are doped. In FIG. 10, the vertical axis and the horizontal axis represent the same as those of FIG. 7A. In the graph of FIG. 10, "a" shows the state before doping, "b" is the case of doping $C_{60}F^-$ of $5.00\times10^{12}$ cm$^{-2}$, "c" is the case of $1.00\times10^{14}$ cm$^{-2}$, and "d" is the case of $4.00\times10^{14}$ cm$^{-2}$. The source/drain voltage at the time of measurement was 10 mV in all the cases. Inversely from the cases of Examples 1, 2, and 3, the n-type conduction appeared on the plus side of the gate voltage decreased in accordance with the increase of the doping concentration of $C_{60}F^-$, and the p-type conduction on the minus side increased. Further, inversely from the cases of Examples 1-3, the $V_T$ value shifted on the plus side in accordance with the increase in the doping concentration of $C_{60}F^-$. It was observed in the experiment that the carbon nanotube channel was converted to the p-type conduction by doping $C_{60}F^-$, which clarified that $C_{60}F^-$ acted as the acceptor for the carbon nanotube. Further, it is found that doping effect of $C_{60}F^-$ is stable for changes over time and $C_{60}F^-$ is a stable acceptor for the carbon nanotube. It is clarified from the experiment that the $E_A$ value 2.76 eV of $C_{60}F^-$ almost equals to the lower limit of the condition for the acceptor, $E_A>2.3$ eV, and that the condition for the acceptor according to the present invention is appropriate.

As described above, it has found that the use of $C_{60}F^-$ enables suppression of the n-type conduction and reinforcement of the p-type conduction in the carbon nanotube transistor, which allows controls of the carrier concentration and the $V_T$ value accurately and continuously.

The same effects as those described above were achieved with fullerene fluorides such as $C_{60}F$, $C_{60}F_2$, $C_{60}F_{36}$, $C_{60}F_{48}$, $C_{70}F_2$, $C_{70}F_{52}$, higher fullerene, and endohedral metallofullerenes.

Example 5

Figure 11:
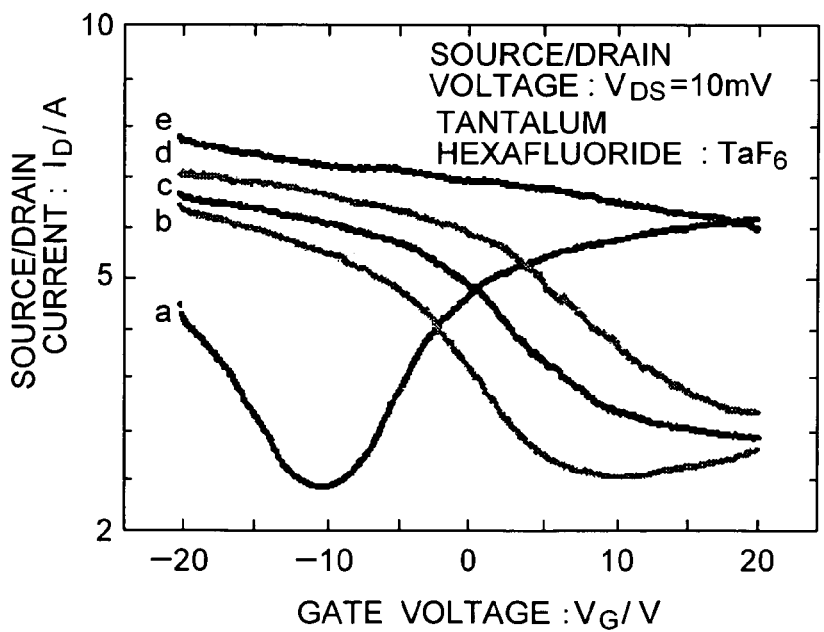
FIG. 11 is a graph for showing changes in the transistor electric characteristic when the dopant concentration of the dopant material is varied according to Example 5 of the present invention.

FIG. 11 is a graph for showing the $I_D$-$V_G$ characteristic of the carbon nanotube transistor to which tantalum hexafluoride negative ions ($TaF_6^-$) are doped. In FIG. 11, the vertical axis and the horizontal axis represent the same as those of FIG. 7A. In the graph of FIG. 11, "a" shows the state before doping, "b" is the case of doping $TaF_6^-$ of $5.00\times10^{12}$ cm$^{-2}$, "c" is the case of $3.00\times10^{14}$ cm$^{-2}$, "d" is the case of $7.00\times10^{14}$ cm$^{-2}$, and "e" is the case of $1.00\times10^{15}$ cm$^{-2}$. The source/drain voltage at the time of measurement was 10 mV in all the cases. As in the case of Example 4, the n-type conduction appeared on the plus side of the gate voltage decreased in accordance with the increase of the doping concentration of $TaF_6^-$, and the p-type conduction on the minus side of the gate voltage increased. Particularly, in the case of "b" where $TaF_6^-$ of $5.00\times10^{12}$ cm$^{-2}$ was doped, most of the n-type conduction disappeared with relatively small doping concentration, indicating that it functioned as a strong acceptor. This may be caused due to an extremely high $E_A$ value (8.4 eV) of $TaF_6$.

Comparing $I_D$ values at $V_G=-20V$, the value after doping increased almost twice the value before doping. This can be interpreted that the holes as the carries within the carbon nanotube has almost doubled. As in Example 4, the $V_T$ value shifted on the plus side in accordance with the increase in the doping concentration of $TaF_6^-$. From the observation described above, it was shown that the carbon nanotube channel was converted to the p-type conduction by doping $TaF_6^-$, which clarified that $TaF_6^-$ served as effective acceptor for the carbon nanotube. Further, it is found that doping effect of $TaF_6^-$ is stable for changes over time and $TaF_6^-$ is a stable donor for the carbon nanotube. Another notable point was that after doping $TaF_6^-$ of $1.0\times10^{15}$ cm$^{-2}$ as in "e", $V_G$ dependence of $I_D$ drastically decreased and almost a constant and high $I_D$ was maintained at $VG \leq |20V|$. This indicates that the semiconductor carbon nanotube can become metallic by sufficiently doping $TaF_6^-$. Such phenomenon is not observed with $C_{60}F$ having the low $E_A$ value ($E_A=2.78$ eV), so that it is considered that this phenomenon occurs because the $TaF^-$ has the high $E_A$ value (8.4 eV). As described above, it has found that the use of $TaF^-$ as the dopant enables suppression of the n-type conduction and reinforcement of the p-type conduction in the carbon nanotube transistor, which allows controls of the carrier concentration and the $V_T$ value accurately and continuously.

The cases of $Ta_2F_{11}$ and $Ta_3F_{16}$ shown in FIG. 3B achieved greater effects than those of $TaF_6$ described above. Furthermore, in the cases of using super halogen materials other than those described, the effects similar to the case of $TaF_6$ were obtained.

By way of examples, the present invention can be applied to electronic appliances and optical equipment, which mount semiconductor devices such as transistors, diodes, light-emitting devices, laser oscillating devices, logic circuits, sensors, etc.

What is claimed is:

1. A semiconductor device comprising, as the device, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube, wherein the ionization potential of the donor in vacuum is 6.4 eV or less.

2. A semiconductor device comprising, as the device, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube, wherein the electron affinity of the acceptor in vacuum is 2.3 eV or more.

3. The semiconductor device according to claim 1, wherein the donor contains one kind or two kinds or more of materials selected from a group consisting of an alkaline earth metal element, a typical metal element, a lanthanide metal element, and an organic metal compound.

4. The semiconductor device according to claim 3, wherein the alkaline earth metal element, the typical metal element, or the lanthanide metal element is any one of strontium (Sr), barium (Ba), indium (In), lanthanum (La), cerium (Ce), praseodymium (Pr), neodymium (Nd), samarium (Sm), europium (Eu), and lutetium (Lu).

5. The semiconductor device according to claim 3, wherein the organic metal compound is metallocene.

6. The semiconductor device according to claim 5, wherein the metallocene is cobaltocene ($ÿ(C_5H_5)_2Co$), chromocene ($ÿ(C_5H_5)_2Cr$), decamethylcobaltocene ($ÿ[C_5(CH_3)_5]_2Co$), decamethylchromocene ($ÿ[C_5(CH_3)_5]_2Cr$), or decamethyl-nickelocene ($ÿ[C_5(CH_3)_5]_2Ni$).

7. The semiconductor device according to claim 2, wherein the acceptor is a fullerene and/or super halogen.

8. The semiconductor device according to claim 7, wherein the fullerene is any one of higher fullerenes such as $C_{74}$, $C_{76}$, $C_{78}$, $C_{80}$, $C_{82}$, endohedral metallofullerenes such as $Ca@C_{60}$, $La@C_{74}$, $Gd@C_{74}$, $Gd@C_{76}$, $Gd@C_{78}$, $Gd@C_{80}$, $Gd@C_{82}$, and fullerene fluorides such as $C_{60}F$, $C_{60}F_2$, $C_{60}F_{36}$, $C_{60}F_{48}$, $C_{70}F_2$, $C_{70}F_{52}$.

9. The semiconductor device according to claim 7, wherein the super halogen is any one of aluminum tetrafluoride ($AlF_4$), hafnium hexafluoride ($HfF_6$), tantalum hexafluoride ($TaF_6$), tungsten hexafluoride ($WF_6$), rhenium hexafluoride ($ReF_6$), osmium hexafluoride ($OsF_6$), iridium hexafluoride ($IrF_6$), platinum hexafluoride ($PtF_6$), gold hexafluoride ($AuF_6$), mercury hexafluoride ($HgF_6$), arsenic hexafluoride ($AsF_6$), phosphorus hexafluoride ($PF_6$), antimony hexafluoride ($SbF_6$), tellurium heptafluoride ($TeF_7$), tungsten heptafluoride ($WF_7$), manganese octafluoride ($MnF_8$), aluminum heptafluoride ($Al_2F_7$), diphosphorus hendecafluoride ($P_2F_{11}$), ditantalum hendecafluoride ($Ta_2F_{11}$), divanadium hendecafluoride ($V_2F_{11}$), tritantalum hexadecafluoride ($Ta_3F_{16}$), triarsenic hexadecafluoride ($As_3F_{16}$), phosphorus hexachloride ($PCl_6$), dialuminum heptachloride ($Al_2Cl_7$), phosphorus hexabromine ($PBr_6$), or dialuminum heptabromine ($Al_2Br_7$).

10. A transistor comprising, as a channel of the transistor, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube, wherein the ionization potential of the donor in vacuum is 6.4 eV or less.

11. A transistor comprising, as a channel of the transistor, a semiconductor material that is obtained by depositing, on a carbon nanotube, a donor with a smaller ionization potential than an intrinsic work function of the carbon nanotube or an acceptor with a larger electron affinity than the intrinsic work function of the carbon nanotube, wherein the electron affinity of the acceptor in vacuum is 2.3 eV or more.

12. The transistor according to claim 10, wherein the donor contains one kind or two kinds or more of materials selected from a group consisting of an alkaline earth metal element, a typical metal element, a lanthanide metal element, and an organic metal compound.

13. The transistor according to claim 12, wherein the alkaline earth metal element, the typical metal element, or the lanthanide metal element is any one of strontium (Sr), barium (Ba), indium (In), lanthanum (La), cerium (Ce), praseodymium (Pr), neodymium (Nd), samarium (Sm), europium (Eu), and lutetium (Lu).

14. The transistor according to claim 12, wherein the organic metal compound is metallocene.

15. The transistor according to claim 14, wherein the metallocene is cobaltocene ($ÿ(C_5H_5)_2Co$), chromocene ($ÿ(C_5H_5)_2Cr$), decamethylcobaltocene ($ÿ[C_5(CH_3)_5]_2Co$), decamethylchromocene ($ÿ[C_5(CH_3)_5]_2Cr$), or decamethyl-nickelocene ($ÿ[C_5(CH_3)_5]_2Ni$).

16. The transistor according to claim 11, wherein the acceptor is a fullerene and/or super halogen.

17. The transistor according to claim 16, wherein the fullerene is any one of higher fullerenes such as $C_{74}$, $C_{76}$, $C_{78}$, $C_{80}$, $C_{82}$, endohedral metallofullerenes such as $Ca@C_{60}$, $La@C_{74}$, $Gd@C_{74}$, $Gd@C_{76}$, $Gd@C_{78}$, $Gd@C_{80}$, $Gd@C_{82}$, and fullerene fluorides such as $C_{60}F$, $C_{60}F_2$, $C_{60}F_{36}$, $C_{60}F_{48}$, $C_{70}F_2$, $C_{70}F_{52}$.

18. The transistor according to claim 16, wherein the super halogen is any one of aluminum tetrafluoride ($AlF_4$), hafnium hexafluoride ($HfF_6$), tantalum hexafluoride ($TaF_6$), tungsten hexafluoride ($WF_6$), rhenium hexafluoride ($ReF_6$), osmium hexafluoride ($OsF_6$), iridium hexafluoride ($IrF_6$), platinum hexafluoride ($PtF_6$), gold hexafluoride ($AuF_6$), mercury hexafluoride ($HgF_6$), arsenic hexafluoride ($AsF_6$), phosphorus hexafluoride ($PF_6$), antimony hexafluoride ($SbF_6$), tellurium heptafluoride ($TeF_7$), tungsten heptafluoride ($WF_7$), manganese octafluoride ($MnF_8$), aluminum heptafluoride ($Al_2F_7$), diphosphorus hendecafluoride ($P_2F_{11}$), ditantalum hendecafluoride ($Ta_2F_{11}$), divanadium hendecafluoride ($V_2F_{11}$), tritantalum hexadecafluoride ($Ta_3F_{16}$), triarsenic hexadecafluoride ($As_3F_{16}$), phosphorus hexachloride ($PCl_6$), dialuminum heptachloride ($Al_2Cl_7$), phosphorus hexabromine ($PBr_6$), or dialuminum heptabromine ($Al_2Br_7$).

* * * * *